United States Patent
Alles

(10) Patent No.: US 9,625,527 B2
(45) Date of Patent: Apr. 18, 2017

(54) DETECTING EFFICIENCY REDUCTION AND PENDING FAILURE OF ELECTRIC MOTORS AND DEVICES

(75) Inventor: Harold Gene Alles, Lake Oswego, OR (US)

(73) Assignee: VERLITICS LLC, Portland, OR (US)

( * ) Notice: Subject to any disclaimer, the term of this patent is extended or adjusted under 35 U.S.C. 154(b) by 1062 days.

(21) Appl. No.: 13/598,402

(22) Filed: Aug. 29, 2012

(65) Prior Publication Data

US 2014/0067326 A1  Mar. 6, 2014

(51) Int. Cl.
*G01K 11/30* (2006.01)
*G01R 31/34* (2006.01)
*G06F 11/30* (2006.01)

(52) U.S. Cl.
CPC .................. *G01R 31/343* (2013.01)

(58) Field of Classification Search
CPC ..... H02H 3/006; H02H 7/0833; G01R 31/343
See application file for complete search history.

(56) References Cited

U.S. PATENT DOCUMENTS

| | | | |
|---|---|---|---|
| 4,858,141 A | 8/1989 | Hart et al. | |
| 5,216,623 A | 6/1993 | Barrett et al. | |
| 5,483,153 A | 1/1996 | Leeb et al. | |
| 5,572,438 A | 11/1996 | Ehlers et al. | |
| 5,706,191 A | 1/1998 | Bassett et al. | |
| 6,470,283 B1 | 10/2002 | Edel | |
| 6,868,293 B1 | 3/2005 | Schurr et al. | |
| 6,906,617 B1 | 6/2005 | Van der Meulen | |
| 6,983,210 B2 | 1/2006 | Matsubayashi et al. | |
| 7,174,260 B2 | 2/2007 | Tuff et al. | |
| 7,246,014 B2 | 7/2007 | Forth et al. | |
| 7,343,226 B2 * | 3/2008 | Ehlers ................. | F24F 11/0012 700/276 |
| 7,379,997 B2 | 5/2008 | Ehlers et al. | |
| 7,423,546 B1 | 9/2008 | Aisa | |
| 7,460,930 B1 * | 12/2008 | Howell ................. | G01D 4/002 700/295 |

* cited by examiner

*Primary Examiner* — Phuong Huynh

(57) ABSTRACT

A method can include collecting time traces for N calibration instances of a device and identifying a key feature for the device based on the time traces. The method can also include using an equation to determine a key feature variation based on a predicted value and a measured value for each new qualified instance of the device. The method can also include generating an alert based on the key feature variation.

4 Claims, 10 Drawing Sheets

DETECTING EFFICIENCY REDUCTION AND PENDING FAILURE OF ELECTRIC MOTORS AND DEVICES

TECHNICAL FIELD

This disclosure relates generally to time trace disaggregation processes, and more particularly to processes and operations for monitoring the efficiency of certain electric motors and other devices.

BACKGROUND

Previous processes for identifying multiple individual loads supplied by a common AC power service use measurements of electrical parameters of only the common supply. These parameters are digitally measured for each alternating current (AC) supply cycle, e.g., 60 samples per second in North America. The loads are identified using the time dependent behaviors (referred to herein as time traces) of the first few seconds of the turn-on positive transition of these parameters. Most devices found in residential and light commercial buildings produce unique time traces. These devices can be identified and tracked using a time trace disaggregation process (referred to herein as a TTDP process).

Many devices identified and tracked in residential and commercial buildings have motors and connected machinery that consume substantial energy. Some of the various types of examples include refrigerators, air conditioners, pumps, and fans. The operations of these devices are often taken for granted and, unfortunately, the devices are usually not serviced until they fail.

Such failure is usually progressive and accompanied by a loss of efficiency. For example, a common failure mode of air conditioners is slow leakage of the refrigerant. As the refrigerant leaks, the air conditioner becomes less efficient and must run longer to produce the same amount of cooling. Eventually, the air conditioner runs continuously because it can no longer maintain the set temperature. It may take days, weeks, months, or even years for complete failure to occur. During this time, the building occupant may not notice the increase in energy usage or, if he or she does take note, attribute the increase in energy use to changes in weather or some other reason. Hundreds or even thousands of dollars may be wasted before the problem is detected, let alone fixed. Further, the problem or failure is most likely to be detected on a hot day when service is unavailable because other systems have failed and all available service technicians are already busy.

Some progressive failures do not affect efficiency but do affect reliability. A necessary component typically degrades until it causes complete failure. Refrigeration and air conditioning in some commercial buildings are required for operation. In such settings, failure may cause loss of goods and/or business. While this equipment may be covered by a service agreement and even checked on a regular bases, the failing component may be difficult to check.

For example, many motors use a start capacitor for 0.1 to 1 second while starting. If the capacitor begins to fail, the motor will continue to start until an operating threshold is reached. Eventually, the motor will not start. This type of failure is usually abrupt.

As another example, large power loads such as air conditioners are generally turned on and off by a mechanical relay. Such relays typically fail because the contacts erode due to arcing. The arcing generally occurs only during startup, so the load may continue to start until a contact completely fails.

Capacitors and relays are relatively inexpensive components. In fact, such components typically have a cost that is much less than that associated with a service call to replace them. If a pending failure of such components were known or identified, the components would desirably be replaced during a scheduled maintenance visit. This would significant increase the reliability of the equipment while reducing the total overall maintenance cost.

While individual devices can be equipped with monitors that detect inefficient operation and potential failures, these devices are typically expensive and generally cost-effective only in certain special cases. Therefore, there remains a need for an inexpensive process that monitors the operating efficiency and pending failures of common electrical devices found in residential and commercial buildings.

SUMMARY

Certain implementations of the disclosed technology may include a process or multiple processes for monitoring the operating efficiency and pending failures of certain, e.g., common, electrical devices found in residential buildings, commercial buildings, or other types of buildings. When a loss of efficiency or pending failure is detected, a process may generate and send an alert to the building occupants, building management, and/or corresponding maintenance organization. In addition, a process may make regular reports and/or support queries regarding the condition and operating status of pertinent devices.

Certain implementations of the disclosed technology may include a continuous measuring of the efficiency of certain identified devices using information in the turn-on transition of the device. Alternatively or in addition thereto, an alert may be generated when the efficiency of certain identified devices is reduced by a predetermined amount using information in the turn-on transition of the device. Alternatively or in addition thereto, an alert may be generated when the operating conditions of certain identified devices exceed predetermined ranges using information in the turn-on transition of the device. Alternatively or in addition thereto, an alert may be generated when certain components of certain identified devices are in the process of failing, even though the pending failure does not affect efficiency, using information in the turn-on transition of the device.

Certain implementations of the disclosed technology may support queries and/or provide regular reports regarding the operating conditions of certain identified electrical devices.

DETAILED DESCRIPTION

Prior processes have been used for capturing the time traces of an instance produced by an on-off cycle of a device. Such applications have also used processes for describing time traces using sequential features.

Each feature of a time trace may be specified by the following triplet of values:

1. Feature type (e.g., one of up to 14 predetermined features noted below)
2. Sample number, e.g., when the feature occurred
3. Parameter value, e.g., when the feature occurred The following is a listing of certain predetermined features:

1. Check-point—the sample value is reported every 50 samples independent of other features. For example, Check-point(100) occurs 100 samples after the start.
2. Positive large peak—a rapid large increase in value followed by a rapid large decrease. The peak is generally at least 2.5 times larger than reference values.
3. Negative large peak—a rapid large decrease in value followed by a rapid large increase. The peak is generally at least 2.5 times larger than reference values.
4. Positive small peak—a rapid large increase in value followed by a rapid large decrease. The peak is generally less than 2.5 times larger than reference values.
5. Negative small peak—a rapid large decrease in value followed by a rapid large increase. The peak is generally less than 2.5 times larger than reference values.
6. Positive step—a rapid increase followed by relatively stable samples.
7. Negative step—a rapid decrease followed by relatively stable samples.
8. Maximum value—the maximum value in a local region. Hysteresis may be used so that only significant extremes are detected. A minimum value generally occurs before another maximum can occur.
9. Minimum value—the minimum value in a local region. Hysteresis may be used so that only significant extremes are detected. A maximum value generally occurs before another minimum can occur.
10. Maximum positive slope—the local maximum positive slope determined by a linear equation fit using four adjacent samples. Hysteresis may be used so that only significant extremes are detected.
11. Minimum slope—the local minimum of the absolute slope determined by a linear equation fit using four adjacent samples. Hysteresis may be used so that only significant extremes are detected.
12. Maximum negative slope—the local maximum of negative slope determined by a linear equation fit using four adjacent samples. Hysteresis may be used so that only significant extremes are detected.
13. Decay—a feature similar to an exponential decay that generally occurs only once in a trace and at least two samples after a positive peak.
14. End of trace—the end of the trace description.

Figure 1A:
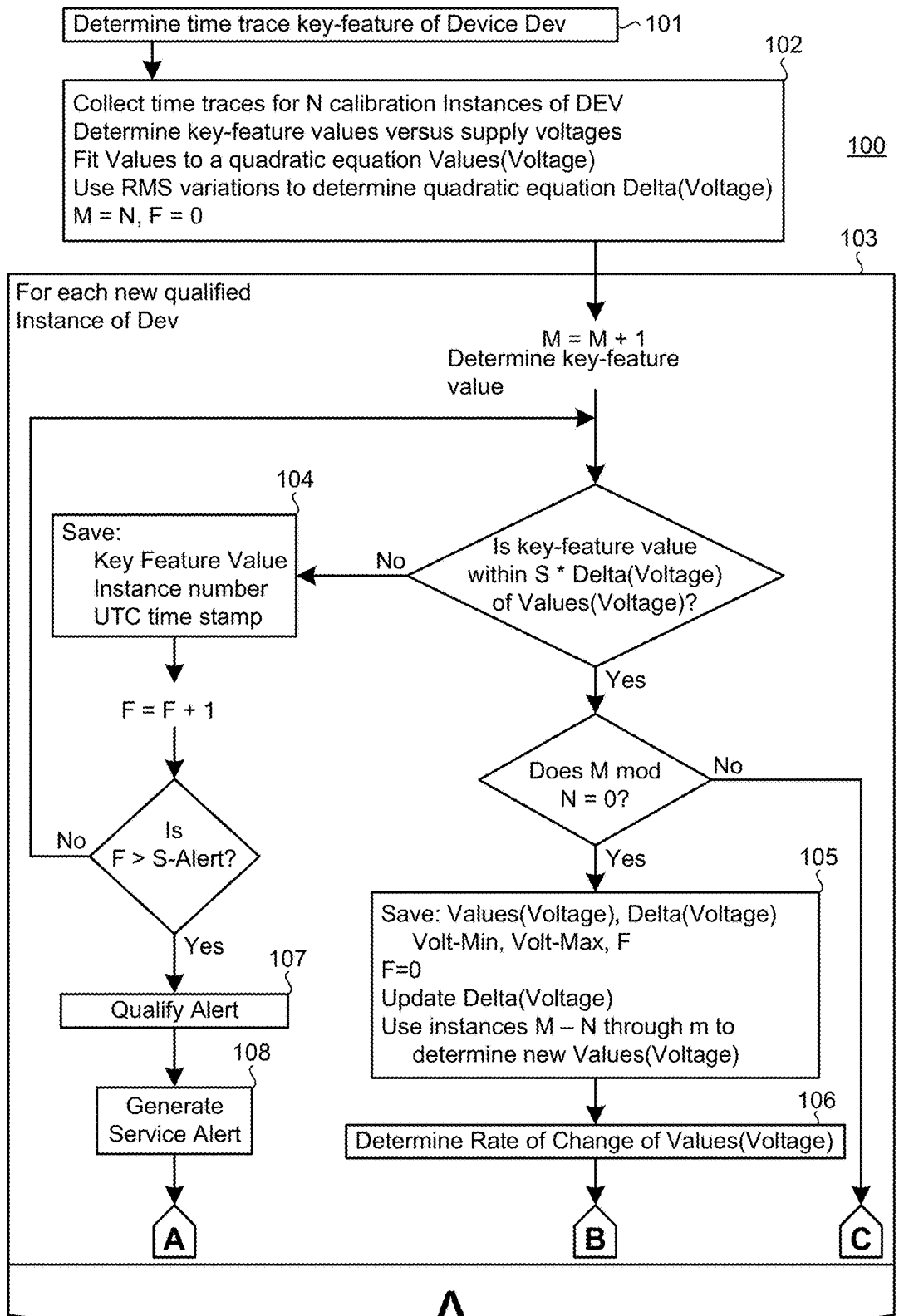
FIGS. 1A and 1B illustrate a high-level flow diagram of a general process suitable for use in calibrating and monitoring variations in a predetermined time trace key feature that indicates a predetermined operating condition of a predetermined electric device type.
Figure 1B:
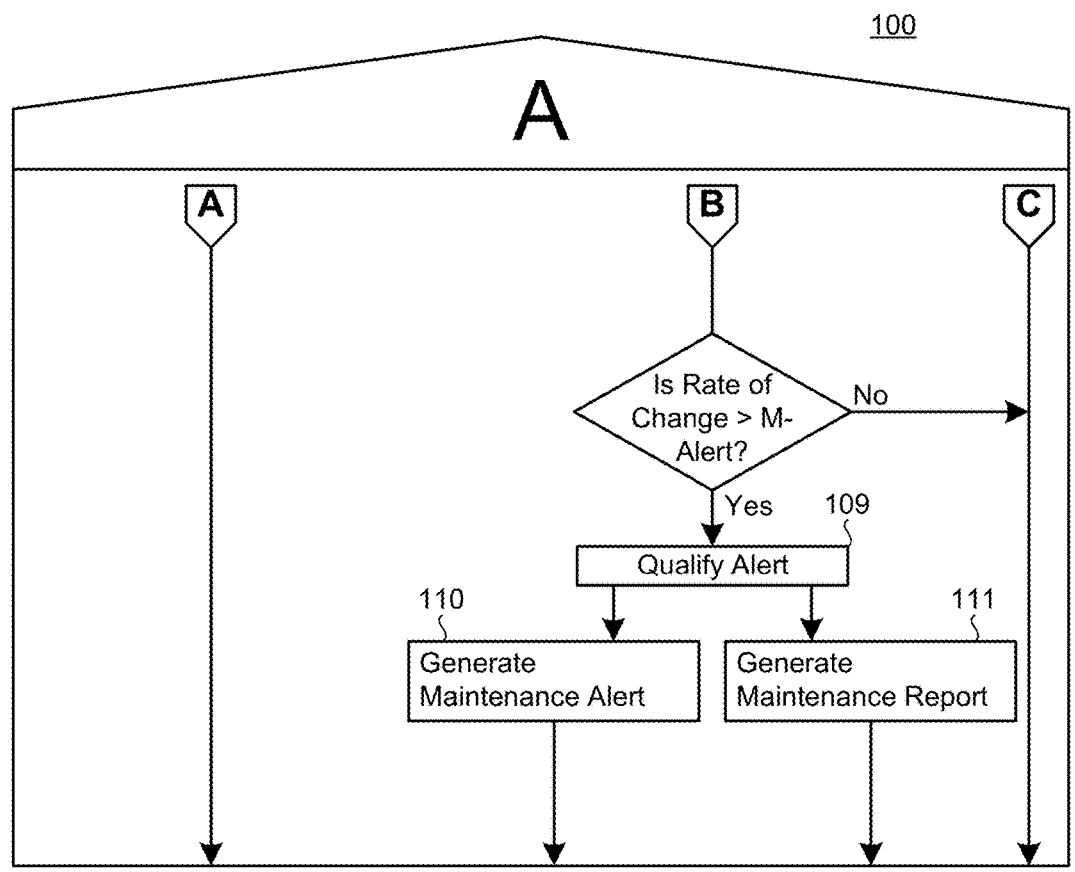

FIGS. 1A and 1B together illustrate a high-level flow diagram of a general process 100 suitable for use in calibrating and monitoring variations in a predetermined time trace key feature that indicates a predetermined operating condition of a predetermined electric device type.

At sub-process 101, the key feature in a time trace of a device that is a reliable indicator of a predetermined operating condition of that device is determined. Operating conditions of interest generally include the efficiency of operation or any indication of a pending failure of at least one component of the device. This sub-process 101 may be performed in a laboratory by cycling a device while a predetermined operating condition is independently varied.

For example, the load on a motor can be systematically varied as it is cycled. The time trace features of each cycle may then be analyzed for systematic variations that correlate to the load changes. The feature that is most indicative of load variations may be considered the key feature for load variation for that motor type.

As another example, the value of a run capacitor can be systematically changed as the motor is cycled. The feature that is most responsive to changes in the run capacitor value may be considered the key feature for run capacitor failure of that motor type.

Sub-process 101 may also be performed using historical data from a building having therein a device with a known failure. The time traces for instances that occurred at various times before the failure may be compared to determine the key feature that was most indicative of the pending failure.

Failures as described herein are generally associated with generic devices such as "capacitor start motor" and "refrigerator." The features of the time traces of specific instances may be matched to the general non-specific behavior of a generic device. When an instance is captured, for example, it may be matched to a generic device and then either matched to an existing device that has previously cycled or used as a seed to create a new device. The device may inherit the generic device of its seed instance.

In the example, sub-process 102 is specific to a generic device and the specific operating condition that is monitored. For example, a refrigerator generic device may utilize sub-process 102 to monitor its run capacitor, a second sub-process 102 to monitor the refrigerant charge, and a third sub-process 102 to monitor the environmental temperature of the compressor and condenser.

Sub-process 102 is generally called when N qualified instances are associated with a specific device associated with a generic device that is associated with the specific sub-process 102. Devices enabled to be monitored may be tested periodically to determine whether there are at least N qualified associated instances. An instance may be considered qualified if it has a relatively small match error to the seed instance of the device and if there were no conflicting transitions while its time trace was captured.

While the supply voltage is typically stable, it can vary by 20% (or more) during peak load periods approaching a brownout condition, for example. Supply voltage variation can cause significant changes to a key feature. However, such a change caused by voltage variation should not generate an alert. Sub-process 102 may use a least squares process to fit key feature values as a function of supply voltage to a second order quadratic equation. This equation may take the following form:

$$\text{Values(Voltage)}=AV+BV*\text{Voltage}+CV*\text{Voltage}*\text{Voltage}$$

Sub-process 102 may save the values of the minimum voltage (Volt-min) and the maximum voltage (Volt-max) for the values used to determine the equation. This equation may provide an accurate expected value for supply voltage between Volt-min and Volt-max. Using extrapolation, this equation may also provide a reasonable expected value for voltages that are outside the range of the values used to determine the equation.

Typically, normal unregulated resistive loads use power that is proportional to the square of the supply voltage (e.g., $P=V*V/R$). Some devices, such as refrigerators and air conditioners, have regulated loads that are somewhat independent of the supply voltage. Some other devices, such as ECM motors, are electronically controlled so that the power is independent for a wide range of supply voltage. The quadratic equation Values(Voltage) above may be able to accurately represent this wide range of voltage dependent behaviors.

Sub-process 102 may subsequently use the equation Values(Voltage) to predict the key-feature value for each instance, for example. The absolute difference between the predicted value and the measured value may represent the variation. The maximum variation within each one volt range may be determined, and the set of maximum variations may then be fit to a second order quadratic equation of the following form:

$$\text{Delta(Voltage)}=AD+BD*\text{Voltage}+CD*\text{Voltage}*\text{Voltage}$$

This equation may be used to provide an estimate of the maximum expected difference between the predicted value and the measured value as a function of supply voltage. This estimate may be used by sub-process 103 to determine when to generate an alert, for example.

Sub-process 102 may initialize the variables M and F, which may be used by the monitoring sub-process 103 and are generally unique for each sub-process 102 and each device (Dev).

In the example, sub-process 103 is enabled after sub-process 102 completes the initialization process. When a new instance associated with device Dev is created, sub-process 103 (separate from sub-process 102) may be used to process each monitored key feature of that instance. The variable M as described herein generally counts the total number of qualified instances associated with device Dev.

The value of the specific key feature is generally located in the feature description of the specific time trace. Typically, a feature of a power or reactive power time trace is monitored. The equation Values(Voltage) above may be used to provide a predicted value for the key feature and the equation Delta(Voltage) above may be used to provide an expected maximum variation of the measured value. The variation may be scaled by S to reduce the possibility of a false alert. S is typically 2 but may be more or less depending on the operating stability of the generic device.

If the variation is significantly more than expected, sub-process 104 may be used to save the key feature value for the instance, its instance number, and the UTC time when the instance occurred, for example. This information may be stored in a long-term archive linked to the generic device, for example. The information may be used periodically by other processes or sub-processes to update the specific sub-process 102 for the generic device and the specific monitored key feature. This information may also be used by other processes to better characterize failure processes. For example, it is generally useful to know the amount of time between the first detection of a pending failure and the actual occurrence of the failure. This typically enables more cost-effective scheduling of maintenance.

As used herein, the variable F may be used to count the number of instances with the key feature variation more than expected. A parameter S-Alert may be used to specify the number of variant instances that may be necessary to potentially generate an alert. The S-Alert parameter is typically 10% to 20% of N.

Sub-process 107 may be used to consider other factors to determine whether an alert is warranted and to reduce the possibility of a false alert. One factor is the supply voltage. If the voltage is significantly outside the range previously measured, for example, this may indicate a high probability that the excessive variation is caused by the supply voltage.

Another factor is the distribution in time when the variant instances occurred. If the occurrences are uniformly distributed over many days, weeks, or months, for example, then the variants may be the result of random natural variations. The value of the S-Alert parameter may then be increased to account for the larger variation.

If sub-process 107 qualifies the alert, sub-process 108 may be used to generate a service alert. A level of urgency may be assigned to the alert, depending primarily on the distribution of the variant instances and the values of the key feature, for example. If most of the variants have occurred recently, or if the key feature has changed rapidly, then the urgency may be set to high.

The alert generated at 108 may be configured for delivery via email, text message, and/or via a message on the web interface to the monitor. Alternatively or in addition thereto, the alert may be directed to the building occupant, owner, and/or pertinent maintenance organization.

If the key feature value of the instance does not generate an alert and the variable M is a multiple of N, then sub-process 105 may be used to determine a new equation Delta(Voltage) using all of the M instances. This may extend the range between Volt-min and Volt-max, for example, and may also improve the accuracy of the expected maximum difference.

Sub-process 105 may be used to save the current values of AV, BV, and CV. New values of AV, BV, and CV may be determined using instances M-N through M. The values of all previous AV, BV, and CV may be compared to the new values. If there are at least two previous sets of values (M=>3*N), then a linear extrapolation may be used to predict the new values. If the new values are more then M-Alert different from the extrapolated values, however, then there is a potential need for an alert.

Sub-process 109 may be used to consider several factors to determine whether an alert should be generated. One factor is the range of supply voltages while the M-N through M instances occurred. If the voltages were for a significantly different range than for other sets of instances, the excessive variations were probably a result of voltage variations and, in such situations, an alert should typically not be generated.

Another consideration is the relative change between previous successive sets of AV, BV, and CV. If the current change is approximately the same as previous changes, the excessive variations are probably the result of random or environmental variations and, in such situations, an alert should typically not be generated. However, if the changes are significantly different, then a failure is likely occurring and, in such situations, an alert should be generated.

Another consideration is the number of instances that individually had excessive key feature values. If the most resent value of F is significantly larger than for previous sets of instances, for example, then a failure is probably occurring and, in such situations, an alert should be generated.

Sub-processes 105 and 106 are generally used to monitor relatively long-term changes and trends. The detected problems are probably not urgent and, as a result, may be categorized as preventative maintenance. Therefore, sub-process 110 may be used to generate a maintenance alert that the device can be serviced at a later and more convenient time. The alert generated at 110 may be configured for delivery via email, text message, and/or via a message on the web interface to the monitor.

Because some of the monitored operating conditions may change due to normal wear, the trend may represent a relative measure of the remaining life. Sub-process 111 may be configured to generate a maintenance report each time a new set of N instances are processed, for example. This report may be communicated via email, text message, and/or via a message on the web interface to the monitor. Alternatively or in addition thereto, the report may be queried just before or during regular maintenance.

It will be appreciated that the processes illustrated by FIG. 1 can be adapted to monitor a wide variety of operating conditions of a wide variety of devices. The adaptation requires a significant set of data for each device representative of the range of operating conditions to be monitored. FIG. 2A-9B illustrate portions of the data sets that may be collected in a laboratory and used in the development of specific monitoring processes.

FIGS. 2A-9B illustrates various features of various device time traces that provide information about the operating status of the devices. Generally, the variations in one key feature of the time traces may provide an indication of a specific operating condition.

Figure 2A:
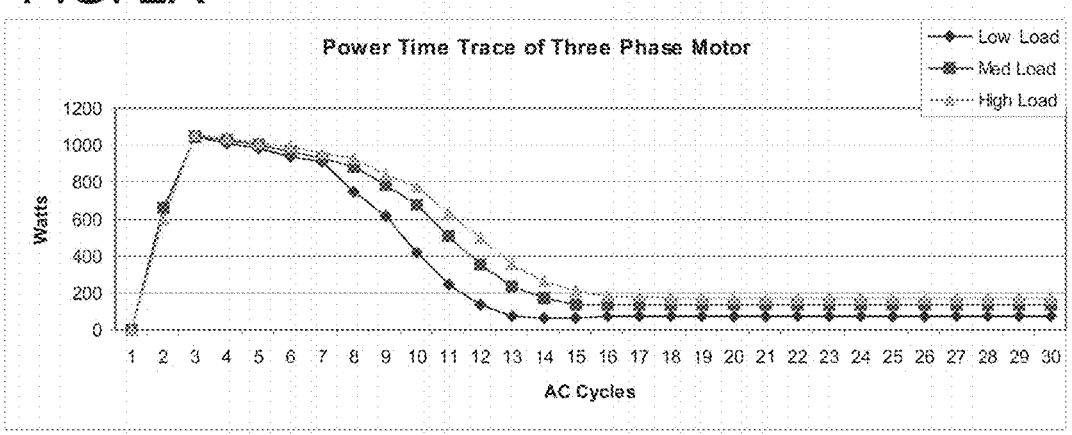
FIGS. 2A, 2B, and 2C are overlay graphs of power, reactive power, and current time traces, respectively, of a three-phase motor for conditions of low, medium, and high load.
Figure 2B:
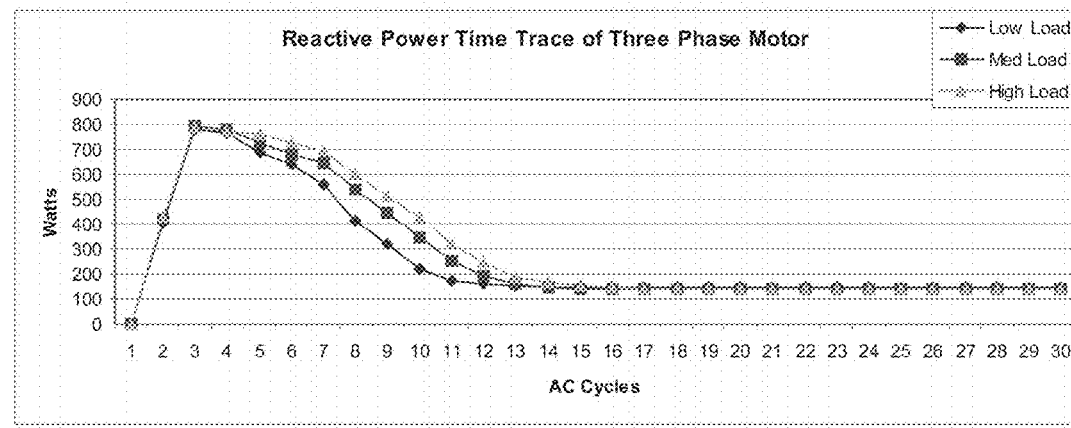
Figure 2C:
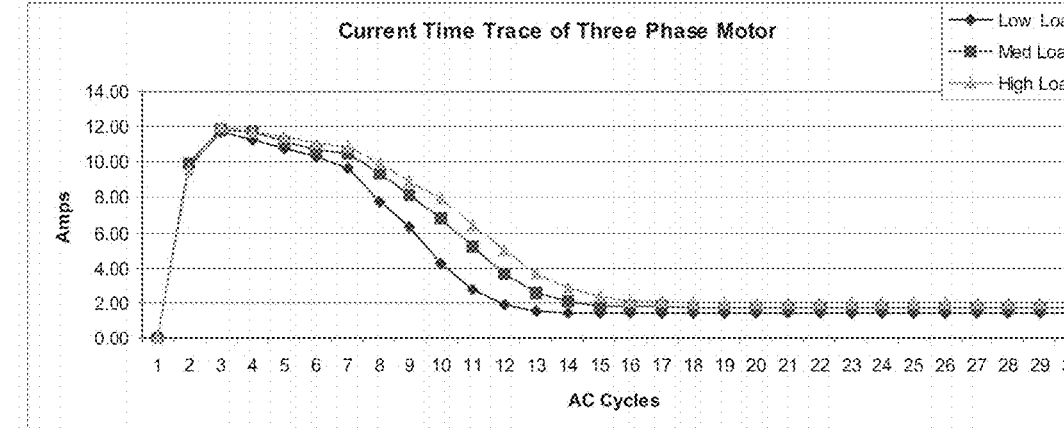

FIGS. 2A, 2B, and 2C are graphs of time traces for a ¾ hp three-phase induction electric motor. In the example, the motor coils are connected in a delta configuration such that no current flows through neutral; rather, all current flow is between the three service legs. Each of the graphs includes time traces for low load (i.e., no external load), medium load (e.g., about 30% of rated capacity) and high load (e.g., about 70% of rated capacity). Each of the time traces is for one of the three supplies. The time traces for each supply are essentially identical.

FIG. 2A illustrates the power time traces for the motor. The power may be calculated by multiplying the voltage (e.g., measured relative to neutral) and the current in the supply. Since the current flow is between supplies with voltages having a relative phase difference of 120 degrees, the current is phase shifted relative to the reference voltage. This generally causes the measured power to be less than the actual power.

The feature description of this time trace has the following sequential features:

Positive Step
Maximum negative slope
Check-point (i.e., at cycle 50—not shown, but the same as cycle 30)

For the different loads, the features with the largest variability are the sample time (10-13) of Maximum negative slope and the value (70-180) of Check-point. Therefore the value of the power Check-point(50) is most indicative of the motor load.

FIG. 2B illustrates the reactive power time traces for the motor. The reactive power may be calculated in a manner similar to that for the power except that the voltage is phase shifted 90 degrees. Since the voltage reference is relative to neutral, the measured reactive power is generally larger than the actual reactive power. The sample number of the maximum negative slope of this time trace has the same variability as that of the power time traces illustrated in FIG. 2A. However, Check-point(50) has very small variations.

FIG. 2C illustrates the current time traces for the motor. The variability of the features is about the same or less than for the power time traces illustrated in FIG. 2A. The current time traces are typically not used to monitor device operating conditions. For the three-phase motor in the example, the key feature that is most indicative of the load is the power Check-point(50).

A time trace disaggregation process (TTDP) may create instances, match the instance to a generic device, and create a device using the first instance as a seed. In operation, the TTDP generally matches the first instance of a three-phase induction motor to the generic three-phase motor. A device may then be created using the first instance as a seed. A three-phase motor process (e.g., sub-process 102 of FIG. 1) may be enabled for the device.

After N (e.g., 50) qualified instances are captured, a sub-process (e.g., sub-process 102 of FIG. 1), may be used to determine equations Values(Voltage) and Delta(Voltage) using the power values of Check-point(50). Thereafter, a three-phase motor process (e.g., sub-process 103 of FIG. 1) may be enabled each time a new qualified instance (e.g., associated with the device) is captured.

Unusual short-term or long-term significant changes in the motor load may generate alerts, and maintenance reports may be generated regularly that track the motor load over time. Different three-phase motors supplied by the same power service may be separately monitored, provided that they are sufficiently different to be identified as separate devices by the TTDP.

Capacitor start motors are common and often used in devices with larger start-up loads. The start capacitor is usually connected in series to a separate motor coil and temperately energized to help start and accelerate the motor to operating speed. A timed relay or centrifugal switch generally controls energizing the start capacitor circuit. The start capacitor typically fails progressively, becoming leaky and having less capacitance over time. As the capacitance is reduced, it generally takes longer to accelerate the motor to operating speed. At some lower capacitor values and loads, the motor will not even start. This failure mode may damage or destroy the motor due to excessive heat.

Figure 3A:
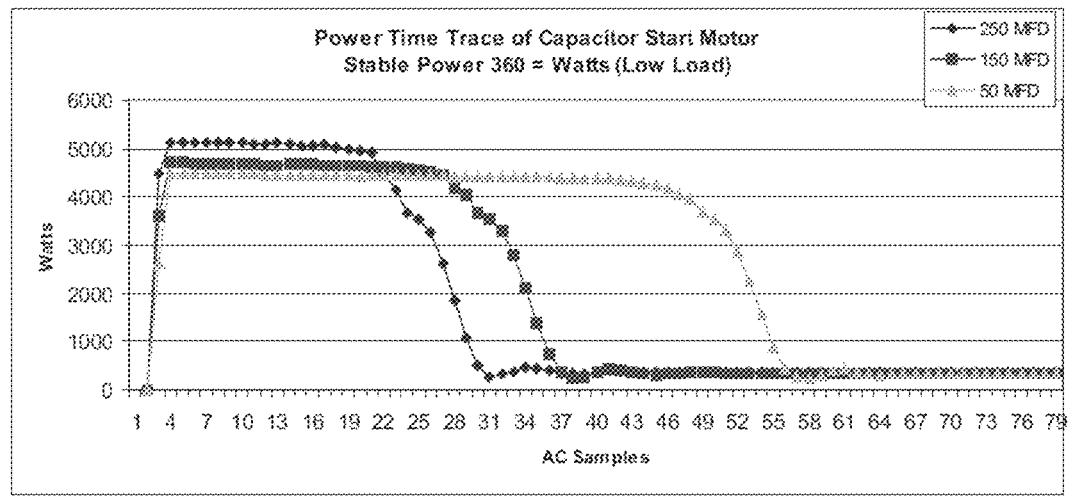
FIGS. 3A and 3B are overlay graphs of power and reactive power time traces, respectively, of a capacitor start motor under low load for start capacitor values of 250 mfd., 150 mfd., and 50 mfd.
Figure 3B:
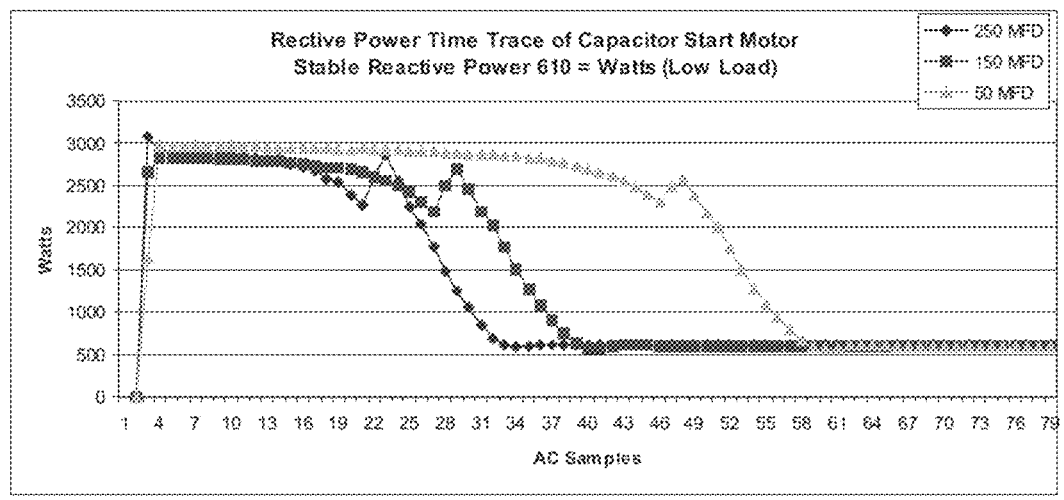
Figure 4A:
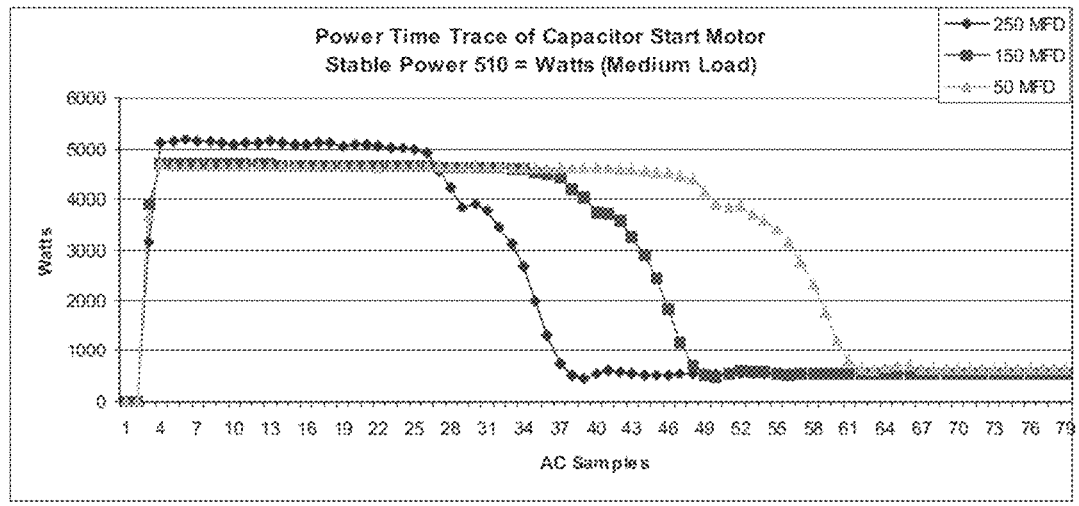
FIGS. 4A and 4B are overlay graphs of power and reactive power time traces, respectively, of a capacitor start motor under medium load for start capacitor values of 250 mfd., 150 mfd., and 50 mfd.
Figure 4B:
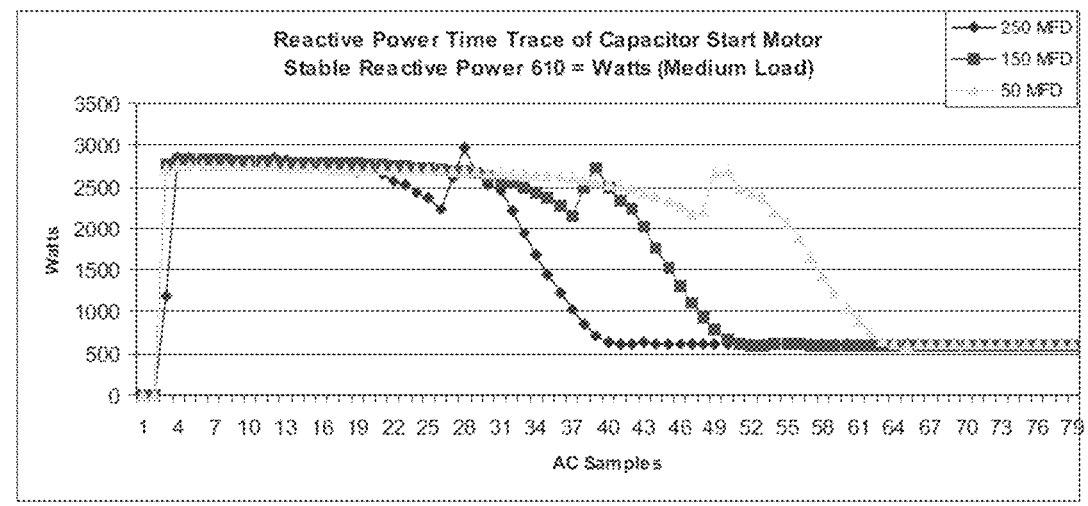
Figure 5A:
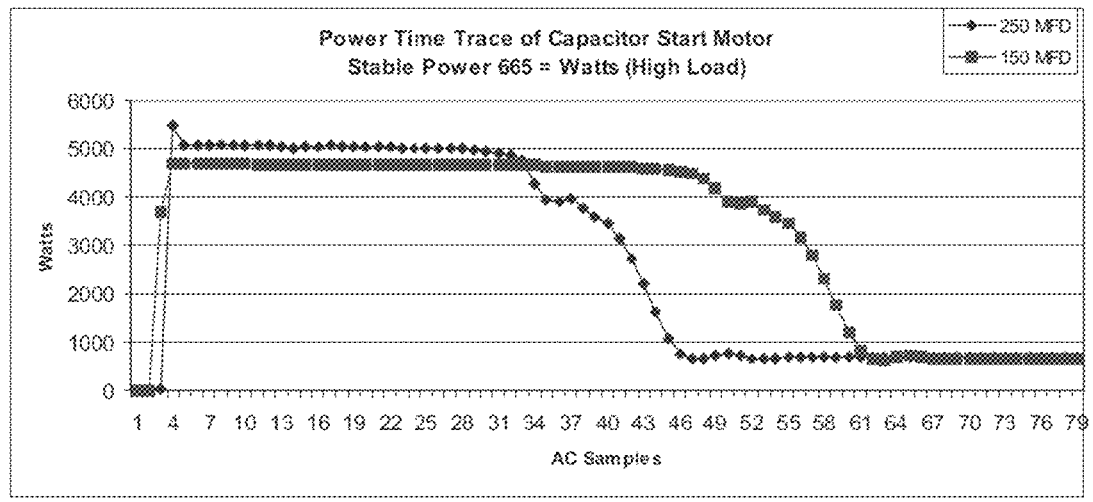
FIGS. 5A and 5B are overlay graphs of power and reactive power time traces, respectively, of a capacitor start motor under high load for start capacitor values of 250 mfd. and 150 mfd.
Figure 5B:
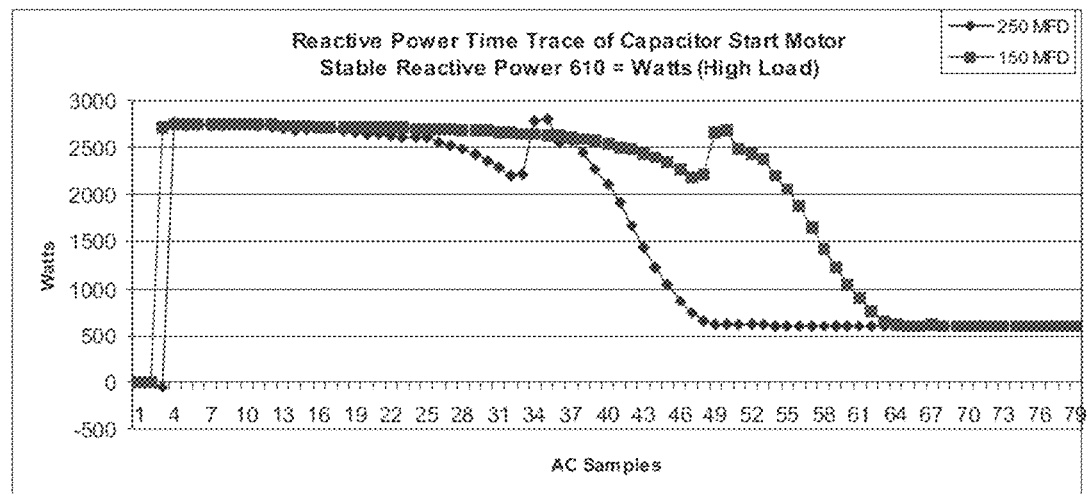

FIG. 3A through 5B are graphs of the power and reactive power time traces of a capacitor start ¾ hp motor for various start capacitors and load combinations. In particular, FIGS. 3A and 3B are for low loads (i.e., no external load), FIGS. 4A and 4B are for medium loads (e.g., about 30% of rated load), and FIGS. 5A and 5B are for high loads (e.g., about 70% of rated load).

The nominal start capacitor for this motor is 250 mfd. Time traces for capacitors of 250 mfd., 150 mfd., and 50 mfd. are shown in FIGS. 3A-4B. Under high load, the motor did not start with a 50 mfd capacitor. Therefore, FIGS. 5A-5B show time traces for only 250 mfd. and 150 mfd. capacitors.

FIGS. 3A, 4A, and 5A show the power time traces. FIGS. 3B, 4B, and 5B show the reactive power time traces. The largest differences between all of the time traces are the sample number when the values transition from large to small. The reactive traces have a small peak just before the rapid drop in value. This is when the start capacitor is de-energized, and occurs when the motor has nearly reached operating speed. The circuit is controlled by a centripetal switch.

The sample number of the small positive peak feature of the reactive power time trace is the most indicative of the size of the start capacitor. However, this key feature is also affected by the load. For low load, the key feature value varies from 22 to 48 for capacitors from 250 mfd. to 50 mfd. For medium load, the key feature value varies from 27 to 49 for capacitors from 250 mfd. to 50 mfd. For high load, the key feature value varies from 33 to 50 for capacitors from 250 mfd. to 150 mfd.

The value of the Check-point(100) feature of the power time trace is the most indicative of the load. It varies from about 350 Watts for low load to about 660 Watts for high load. This key feature is not affected by the start capacitor.

Sub-processes 102 and 103 of FIG. 1 may be adapted for capacitor start motors by adding a function to correct the value of the key parameter for variation in load. The key parameter here is the sample number of the small positive peak feature of the reactive power time trace. Before determining the Values(Voltage) equation, however, the key feature values and the Power Check-point(100) values may be collected for each instance.

The collection of value pairs (S, P) may be used to determine the correction function, where S refers to the sample number of the capacitor key feature and P refers to the value of the Power Check-point(100). The collection may be searched for the minimum P, and its S value may be set to S-min. S-min may then be subtracted from all S in the collection to determine S'. The modified pairs may then be used to determine the best least squares fit to the correction equation Correct(Check-point) of the following form:

$$S' = AS + BS*P + CS*P*P$$

Thereafter, before the key feature value is used, it may be corrected using the following:

Corrected feature value=Feature value−Correct(Check-point(100))

The corrected values may be used to determine Values (Voltage) and when checking for changes that generate alerts.

In the example, this process may enable independent monitoring of the start capacitor and the motor load, as well as the ability to correctly alert for a failing capacitor and also for a change in the motor load.

Another potential failure mode of capacitor start motors is the mechanism that connects and disconnects the capacitor. The circuit connection is usually made by mechanical contact, and the reactive nature of the circuit typically causes arcing when contact is made and broken. This can lead to progressive contact failure, which can first appear as intermittent contact or contact bounce, causing more arcing and accelerated deterioration.

Figure 6A:
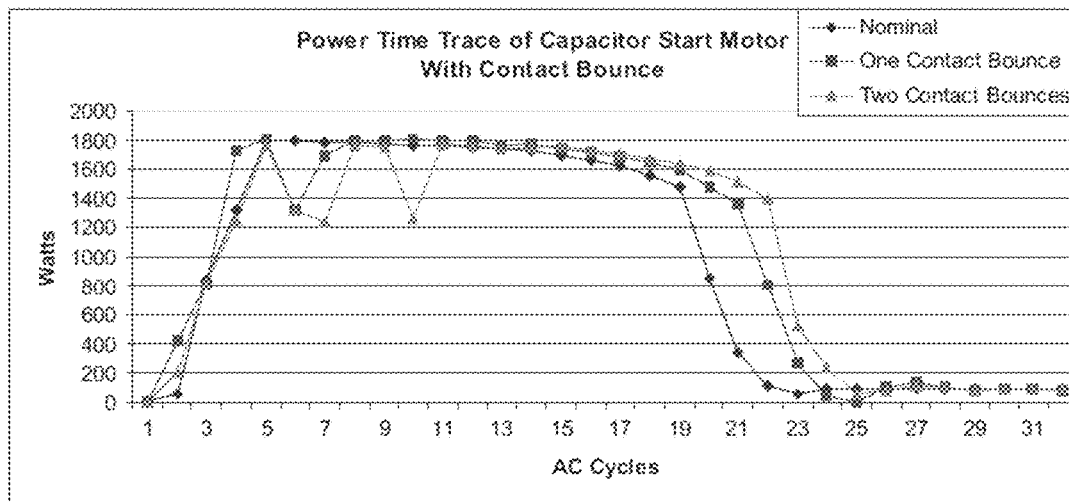
FIGS. 6A and 6B are overlay graphs of power and reactive power time traces, respectively, of a capacitor start motor showing contact bounce in the start capacitor circuit.

FIG. 6A is an overlay graph of the power time trace of a capacitor start motor with intermittent contact bounce. In the example, the first time trace exhibits nominal behavior with no contact bounce, the second time trace has a single contact bounce indicated by a small negative peak near the start, and the third trace has two contact bounces, as indicated by two closely spaced small negative peak features.

Figure 6B:
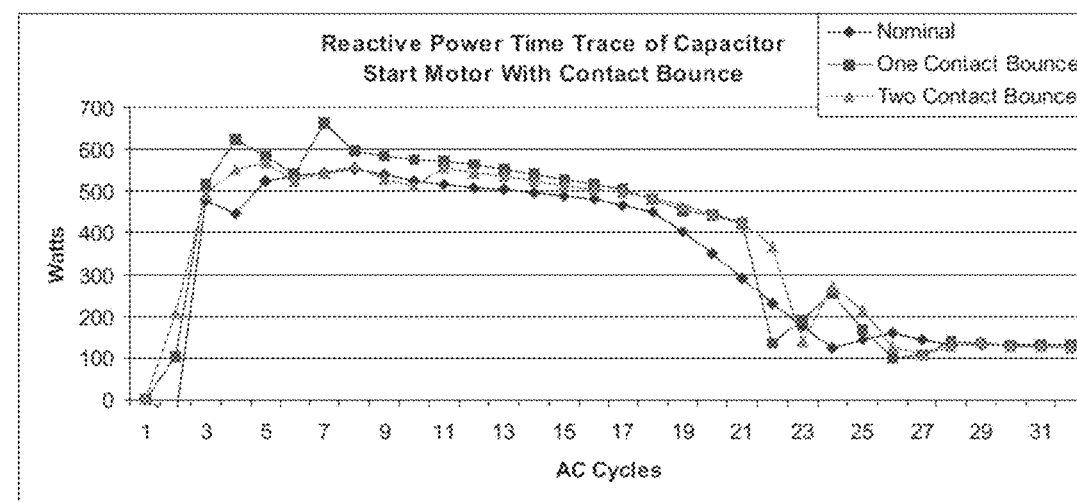

FIG. 6B is an overlay graph of the reactive power time trace corresponding to the power time trace of FIG. 6A. While the graph of FIG. 6B shows some effect of the contact bounce, the indicators are not as consistent. Therefore, the key feature for contact bounce here is the number of small negative peaks near the start.

For this failure mode, the value of the key feature is not relevant. The presence of the feature is the indicator. Sub-processes 102 and 103 of FIG. 1 may be adapted for this simpler case. Here, the equations Values(Voltage) and Delta (Voltages) are not needed; instead, the total number of small negative peaks that occur in N power time traces may be counted and divided by N to determine the average number of bounces per instance. The maximum number of bounces in any single instance may also be determined.

In sub-process 103, the parameter F may be used to count the total number of small negative peaks, and S-Alert may be determined by a scale factor multiplied by the expected number using the average rate and the number of instances since F was set to zero by sub-process 106. A rapid increase in the total number of bounces or the maximum number of bounces in a single time trace may cause a service alert.

Sub-process 106 may be used to determine the long-term trend of the average number of bounces, which may be included in the maintenance report. An increase in the rate of change of the average may cause a maintenance alert.

Refrigerators and/or air conditioners are in many homes and light commercial buildings. These devices are often critical for operation of the building and usually require periodic maintenance. Failures are common, and such devices usually have a finite useful life. The operating efficiency usually decreases with normal wear and with many slow failure modes. The cost of this loss of efficiency may be hundreds or thousands of dollars before it is noticed. Failure may cause business loss while the equipment is repaired. In some cases, equipment may be damaged or destroyed if operated when in need of urgent maintenance or repair. Therefore, the ability to generate alerts for operating conditions that reduce efficiency or predict failure has large value.

Refrigerators and air conditioners have similar behaviors and failure modes. The following disclosure uses a refrigerator for illustration, but the methods and processes may apply to air conditioners or other devices as well.

Figure 7A:
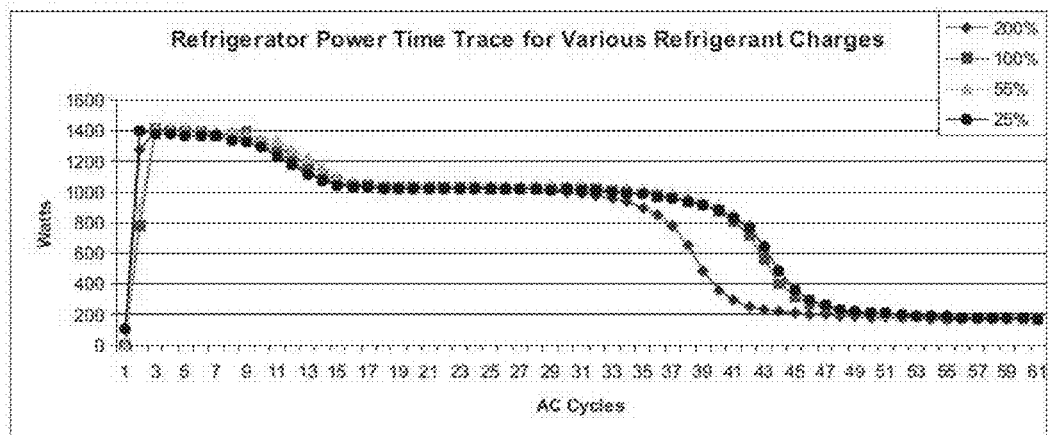
FIG. 7A is an overlay graph of power time traces of a refrigerator with different refrigerant charges.

FIG. 7A is an overlay graph of the power time trace of a typical residential refrigerator for different amounts or refrigerant charge. Refrigerant charges of 200%, 100%, 50%, and 25% are shown in the example. A typical failure mode is the slow leakage of refrigerant. When sufficient refrigerant has leaked, the refrigerator usually cannot maintain the desired temperature and runs continuously. Some refrigerators and nearly all air conditioners can be recharged by a service technician. Generally, an attempt may be made to find and repair the leak. In some cases, however, the technician may add too much refrigerant, so it is useful to monitor for an overcharged condition.

FIG. 7A illustrates that there is very little change in the shape of the time trace as refrigerant is decreased. However, excess refrigerant moves the sample time of the second maximum negative slope earlier by about 5 cycles.

The charge level does affect the stable operating power after the starting. The Check-point(150) feature (not shown if FIG. 7A) may be used to accurately measure the stable operating power.

Figure 7B:
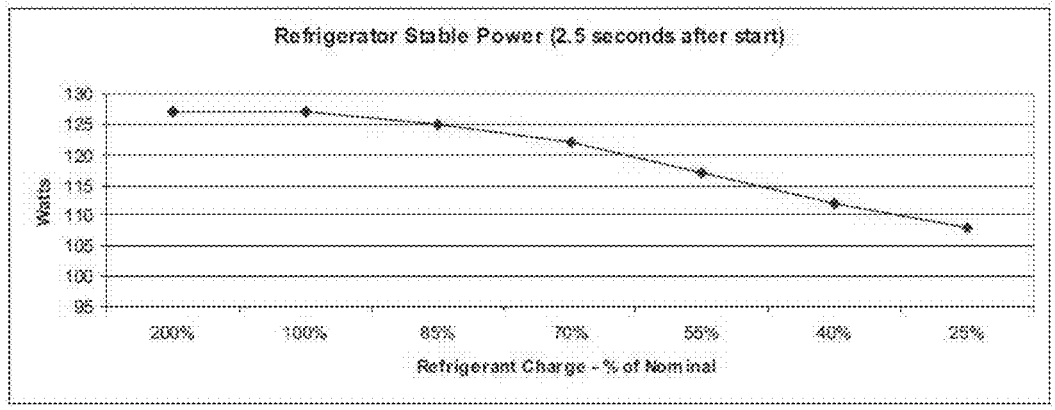
FIG. 7B is a graph of refrigerator power 2.5 seconds after start with different refrigerant charges.

FIG. 7B is a graph of the value of power Check-point (150) as a function of the refrigerant charge. Here, the power decreases as the refrigerant charge decreases. This change is significant and can be accurately measured, especially when corrected for supply voltage variations. The operating power is generally reduced as refrigerant leaks but the run time of each cycle increases, so the total energy used increases.

Figure 7C:
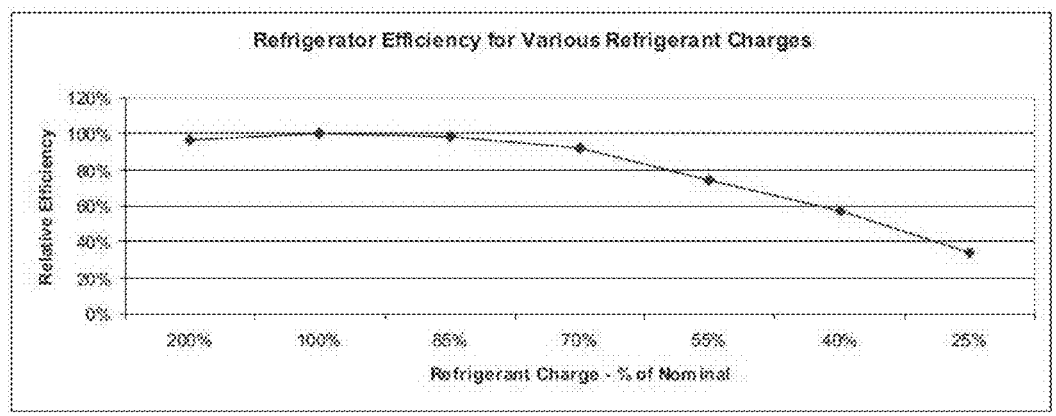
FIG. 7C is a graph of refrigerator relative efficiency with different refrigerant charges.

FIG. 7C is a graph of the relative efficiency as a function of the refrigerant charge. A 50% loss of refrigerant reduces the relative efficiency to 80%. The efficiency then decreases rapidly as refrigerant is lost. Overcharging the refrigerant causes a small but measurable decrease in efficiency. Here, the key feature for monitoring refrigerant charge is the power Check-point(150).

Refrigerators must generally transfer heat to the external environment. This usually occurs in the condenser, where the refrigerant changes from gas to liquid as it releases heat. The heat is usually transferred to air, which must circulate through the condenser. When the airflow is restricted, the condenser temperature usually increases and the refrigerator efficiency decreases. This is a typical indication that the condenser needs to be cleaned. Some refrigerators use a fan to help cool the condenser, but failure of such a fan may also cause the temperature to increase.

Figure 8:
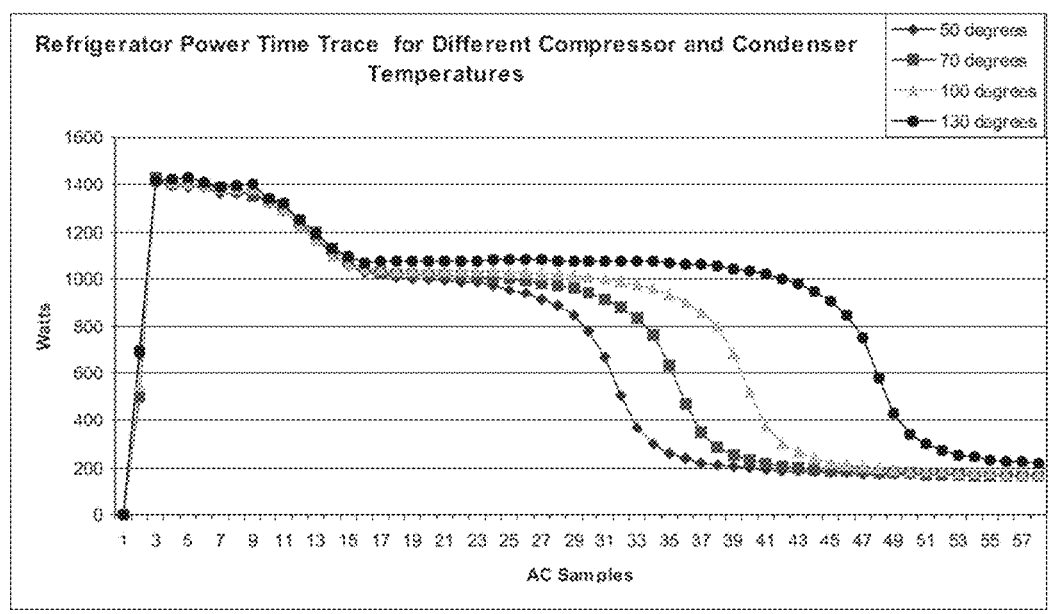
FIG. 8 is an overlay graph of power time traces of a refrigerator with the compressor and condenser at various operating temperatures.

FIG. 8 is an overlay graph of the power time trace for different environmental temperatures. For the laboratory test, the refrigerator compressor and condenser environment were temperature-controlled. The sample number of the second maximum negative slope feature is a strong indicator of the temperature. Monitoring this key feature may enable the generating of alerts and reports regarding the temperature of the condenser and compressor.

Many refrigerators have a defrost cycle about once a day where a heater is used for a short time to melt frost. This generally increases the temperature of the refrigerant and causes a significant change in the key feature. Sub-process 102 and 103 of FIG. 1 may be adapted to detect these cycles and disqualify the instances. Typically, the defrost heater is identified by the TTDP as a separate device, and its cycle may be correlated with the defrost refrigerator cycle. Additionally, defrost cycles may be detected by other time trace features. For example, the value of the power Check-point (100) is typically significantly larger than for a normal refrigerator cycle.

Most refrigerators use a capacitor run motor for the capacitor. The capacitance is generally reduced as it fails and, when small enough, the compressor will not run. For equipment that is regularly serviced or requires high reliability, monitoring the run capacitor thus has high value.

Figure 9A:
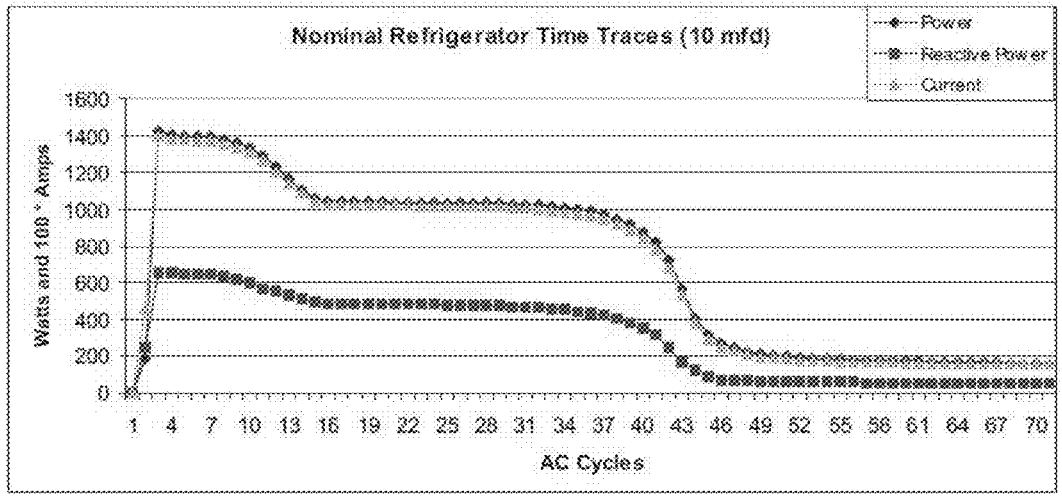
FIG. 9A is an overlay graph of power, reactive power, and current time traces of a refrigerator with nominal 10 mfd. run capacitor.
Figure 9B:
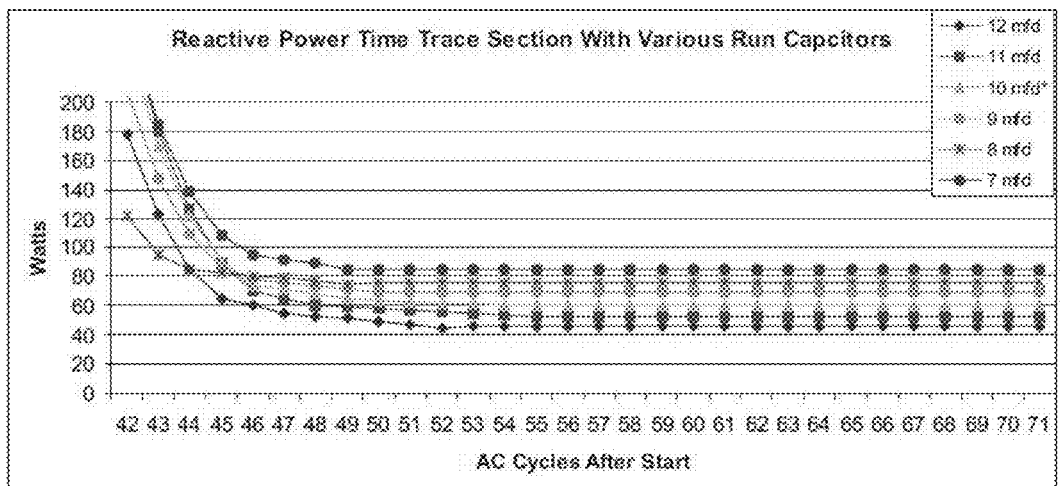
FIG. 9B is an overlay graph of portions of reactive power time traces of a refrigerator for various run capacitors.

FIG. 9A is an overlay graph of a typical refrigerator cycle with a nominal run capacitor of 10 mfd. FIG. 9B is an overlay of a portion of the reactive power time trace for various run capacitors. The left of the graph is sample 42, near the end of the second rapid decrease in reactive power as can be seen in FIG. 9A. The stable value of the reactive power is indicative of the capacitance of the start capacitor. The value of the Check-point(100) feature increases as the capacitance decreases. The compressor does not run with capacitance less than 7 mfd.

Sub-processes 102 and 103 of FIG. 1 may be adapted to monitor for refrigerator run capacitor failure by using the reactive power time trace value of the Check-point(100) feature.

The forgoing has disclosed how the time trace features used by TTDP can be processed and monitored to detect changes in the operating states of various motors and specific devices that use these motors. Those ordinarily skilled in the art can easily adapt the disclosed processes to monitor other operational conditions of other devices and generate alerts and reports.

The monitoring requires only a few seconds of data immediately after the start of the device. Therefore, many independently cycling devices can be separately monitored, provided that the TTDP can identify them separately. Even if multiple identical devices are served by the same power supply, a specific pending failure of one will usually generate an alert and also appear in a report. When a specific failure is detected, it is relatively easy for a service technician to determine which specific device has that specific problem.

Another benefit of the processes disclosed herein is that they can be used to analyze historical data from many buildings to refine monitoring techniques and discover new operating conditions that can be monitored. For example, most motors can be recognized by TTDP, and the time-dependent behavior of each time trace feature can be tracked. If any feature value changes slowly over time and then makes a discontinuous change in the opposite direction, it usually indicates a slow failure followed by repair or replacement. It may be possible to find the single instance when the failure occurred. Likewise, if no more instances of a device occur after a rapid change, then failure and replacement with another device is likely. This can be confirmed if a new device of the same generic type is created and has multiple instances. Therefore, the knowledge base of failure modes for different devices can be grown without any specific additional knowledge about the building or actions taken by the occupants.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A method for using a processor to automatically generate a service alert for an electrical device connected to a power supply, the supply also connected to a plurality of other electrical devices, comprising:

providing to the processor a set of predetermined features and feature values of the turn-on transition of the device, the set of predetermined features and feature values selected such that a turn-on transition of the device is differentiated from a turn-on transition of any of the other devices when the corresponding predetermined features and feature values are compared, identifying to the processor a key feature from the set of predetermined features of the device, the key feature indicative of a need for service, providing to the processor a service alert threshold value of the key feature of the device, providing to the processor digital samples of the supply output power and voltage, providing to the processor instructions to process the digital samples to recognize a turn-on transition of the device and of the other devices and to compute the predetermined features and feature values of the turn-on transition, providing the processor instructions to identify when a turn-on transition is a turn-on transition of the device, and if identified, compare the key feature value of the turn-on transition to the alert threshold value, and if the alert threshold value is exceeded, generate a service alert.

2. The method of claim 1 where the alert threshold value is automatically determined further comprising:

providing the processor instructions to set the service alert threshold value to be a predetermined amount more extreme than the extreme value of the key feature values from a plurality of previous turn-on transitions of the device.

3. The method of claim 1 where the key feature value is scaled to compensate for variation in the supply voltage further comprising:

providing the processor instruction to store the key feature values and corresponding supply voltages from a plurality of previous turn-on transitions of the device, providing the processors instructions to determine the correlation between the stored key feature values and the stored supply voltages, providing the processor instructions to use the determined correlation and the voltage to scale the key feature value of a turn-on transition of the device before comparing to the alert threshold value.

4. A method for using a processor to automatically generate a service alert for an electrical device connected to a power supply, the supply also connected to a plurality of other electrical devices, comprising:

providing to the processor a set of predetermined features and feature values of the turn-on transition of the device, the set of predetermined features and feature values selected such that a turn-on transition of the device is differentiated from a turn-on transition of any of the other devices when the corresponding predetermined features and feature values are compared, identifying to the processor a key feature, occurrences of the key feature indicative of a need for service, providing to the processor a service alert threshold value for number of occurrences of the key feature, providing to the processor digital samples of the supply output power and voltage, providing to the processor instructions to process the digital samples to recognize a turn-on transition of the device and of the other devices and to compute the predetermined features and feature values of the turn-on transition, providing the processor instructions to identify when a turn-on transition is a turn-on transition of the device, and if identified, count the number of occurrences of the key feature, and if the count is larger than the alert threshold value, generate a service alert.

* * * * *